US008502360B2

(12) United States Patent
Sasaki et al.

(10) Patent No.: US 8,502,360 B2
(45) Date of Patent: Aug. 6, 2013

(54) RESIN SEALING TYPE SEMICONDUCTOR DEVICE AND METHOD OF MANUFACTURING THE SAME, AND RESIN SEALING TYPE ELECTRONIC DEVICE

(75) Inventors: Takeshi Sasaki, Ota (JP); Masahiro Shindo, Ashikaga (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 417 days.

(21) Appl. No.: 12/549,152

(22) Filed: Aug. 27, 2009

(65) Prior Publication Data

US 2010/0052124 A1 Mar. 4, 2010

(30) Foreign Application Priority Data

Aug. 28, 2008 (JP) ................................. 2008-219943
Aug. 29, 2008 (JP) ................................. 2008-220979
Apr. 28, 2009 (JP) ................................. 2009-108811

(51) Int. Cl.
*H01L 23/495* (2006.01)

(52) U.S. Cl.
USPC ................... 257/676; 257/666; 257/E23.031; 257/E23.057

(58) Field of Classification Search
USPC ........... 257/676, 666–667, E23.031, E23.057
See application file for complete search history.

(56) References Cited

U.S. PATENT DOCUMENTS

| | | | |
|---|---|---|---|
| 2002/0033555 A1* | 3/2002 | Shimodaira | 264/272.15 |
| 2005/0248009 A1* | 11/2005 | Inoguchi | 257/678 |
| 2006/0054901 A1* | 3/2006 | Shoji et al. | 257/80 |

FOREIGN PATENT DOCUMENTS

| | | |
|---|---|---|
| CN | 1290946 | 4/2001 |
| JP | 59-94449 | 5/1984 |
| JP | 63-257256 | 10/1988 |

(Continued)

OTHER PUBLICATIONS

Handotai Shingijutsu Kenkyukai. (Sep. 25, 2007). "All About Leading Edge Packaging Technologies—with Illustrations" Kogyo Chosakai Publishing Co., Ltd.; 3 pages (Partial English translation).

(Continued)

*Primary Examiner* — Yu-Hsi D Sun
(74) *Attorney, Agent, or Firm* — Morrison & Foerster LLP (57) ABSTRACT

The invention provides a resin sealing type electronic device having high reliability by eliminating a solder burr formed when a tie bar is cut. The invention also prevents a welding failure between a lead of the resin sealing type electronic device and an external electrode, and provides a large area for bonding an electronic component to the lead to prevent a connection failure. In the method of manufacturing the resin sealing type semiconductor device of the invention, in a case that a tie bar is cut after a semiconductor die and so on are mounted on a lead frame and these are resin-sealed, the cutting of the tie bar is performed from the side of the lead frame where a lead burr is formed by presswork. Furthermore, in the resin sealing type electronic device of the invention, a die capacitor is bonded to burr formation surfaces of a lead and an island using conductive paste. Since the burr formation surface has a larger surface area than a rounded surface, a large bonding area is obtained. A welding surface of the lead to a control electrode is the rounded surface that is opposite to the burr formation surface.

5 Claims, 9 Drawing Sheets

FOREIGN PATENT DOCUMENTS

| | | |
|---|---|---|
| JP | 64-54750 | 3/1989 |
| JP | 3-116770 | 5/1991 |
| JP | 4-157761 | 5/1992 |
| JP | 11-347645 | 12/1999 |
| JP | 2005-064076 | 3/2005 |
| JP | 20052099 A * | 8/2005 |

OTHER PUBLICATIONS

Kuroyanagi, S. et al. (Nov. 1985). "Recent Semiconductor Assembly Technology," Published by Oyo-gijutsu-shuppan; with partial English translation.

* cited by examiner

Punching direction

RESIN SEALING TYPE SEMICONDUCTOR DEVICE AND METHOD OF MANUFACTURING THE SAME, AND RESIN SEALING TYPE ELECTRONIC DEVICE

CROSS-REFERENCE OF THE INVENTION

This application claims priority from Japanese Patent Application Nos. 2008-219943, 2008-220979, and 2009-108811, the content of which is incorporated herein by reference in its entirety.

BACKGROUND OF THE INVENTION

1. Field of the Invention

The invention relates to a resin sealing type semiconductor device in which an electronic component and so on are resin-sealed and a method of manufacturing the same. The invention also relates to a resin sealing type electronic device in which an electronic component and so on are resin-sealed.

2. Description of the Related Art

A resin sealing type semiconductor device in which a semiconductor die is sealed in a resin package and a resin sealing type electronic device in which an electronic component and so on are sealed in a resin package have been conventionally known. These resin sealing type semiconductor devices and so on are completed by providing a lead frame, die-bonding various semiconductor dies or electronic components to the lead frame using solder, Ag paste or the like, electrically connecting the semiconductor dies and so on and the lead frame by wire-bonding using an Al wire or an Au wire, resin-sealing these except an outer lead portion, cutting tie bars, and bending leads according to needs. A technique of connecting the outer lead extending from the resin package to an electrode on a PCB substrate by soldering or the like has been also known.

A resin sealing type semiconductor device and a method of manufacturing the same, and a resin sealing type electronic device are described in Japanese Patent Application Publication No. 2005-64076 and "Advanced semiconductor packaging technologies by an illustration book" edited by Semiconductor technologies solutions workshop (the first edition issued on Sep. 25, 2007 by Kogyo Chosakai Publishing Co., Ltd.).

A lead frame used for a resin sealing type semiconductor device or the like is formed by presswork using a Cu member or the like as a base metal. Usually, Ni plating or the like is applied to the surface thereof. Since the presswork is performed by applying high pressure to a metal board made of a Cu member from one side to the other side, small lead burrs are formed on the other side of the lead frame made of the Cu member having viscosity. Ni plating applied to the surface of the lead frame is also applied to these small lead burrs. These lead burrs cause the following problems in a resin sealing type semiconductor device and so on and a process of manufacturing the same, and a resin sealing type electronic device.

In a process of manufacturing a resin sealing type semiconductor device, Sn type alloy plating, Sn type solder plating or the like such as Sn—Cu plating is applied to the surfaces of outer leads in order to obtain the anticorrosiveness and solderability of the surfaces of the outer leads after the resin sealing process is completed, and a process of cutting tie bars and so on are then performed.

In the case of the solder plating, a solder plating layer is formed on all of the outer leads, and the solder is also unstably plated on the small lead burrs formed by the presswork. In the subsequent process of cutting the tie bars, this solder plating layer applied to the small lead burrs peels off to form mustache-like solder burrs, thereby causing a problem of short-circuiting the outer leads and so on.

Furthermore, in a case of using a resin sealing type electronic device by attaching it to an electronic control portion of an automobile, a surface of a bended outer lead may be spot-welded to the side surface of the external electrode of the electronic control portion for a mechanical strength, reliability or the like against the vibration of the automobile. In this case, due to the protruding lead burrs described above, the surface of the outer lead and the surface of the external electrode are not bonded firmly and a welding failure is likely to occur. On the other hand, in a case of bonding an electronic component to an inner lead inside the resin package, since the opposite surface to the lead burr formation surface forms a rounded surface of which the ends are rounded, when an electronic component is bonded to the rounded surface, there occurs a problem that the bonding area is small to cause a connection failure and so on.

SUMMARY OF THE INVENTION

The invention provides a method of manufacturing a resin sealing type semiconductor device. The method includes providing a lead frame comprising an island, a plurality of leads extending from the island and a plurality of tie bars connecting corresponding leads. A surface of the lead frame includes a plurality of burrs standing thereon as a result of presswork. The method also includes die-bonding a semiconductor die to the island of the lead frame, electrically connecting the semiconductor die and the lead frame, sealing the lead frame and the semiconductor die electrically connected to the lead frame by a resin package so that tie bars are exposed from the resin package, and cutting the exposed tie bars from the surface comprising the burrs standing thereon as the result of presswork.

The invention also provides a resin sealing type semiconductor device that includes a lead structure having an island and a plurality of leads. First ends of the leads are near the island. The device also includes a semiconductor die bonded to the island, a plurality of metal wires connecting the semiconductor die and the leads, a resin package sealing the island, the leads and the semiconductor die so that second ends of the leads are exposed from the package, and a plating layer formed on the leads. The lead structure includes a mounting surface on which the semiconductor die is mounted and an opposite surface opposite from the mounting surface. The opposite surface includes a plurality of burrs standing thereon as a result of punching from the mounting surface, and the exposed leads are cut from the opposite surface so that there are no burrs long enough to short circuit the leads as a result of dangling of the cut plating layer.

The invention also provides a resin sealing type electronic device that includes a lead having an electronic component mounting surface and a welding surface opposite from the component mounting surface. The electronic component mounting surface includes a plurality of burrs standing thereon as a result of punching a metal board using a mold from the welding surface. The device also includes an electronic component bonded to the electronic mounting surface of the lead, a resin package sealing the electronic component and the lead so that a part of the lead is exposed from the package, and an external electrode on which a portion of the welding surface of the exposed lead is welded.

The invention further provides a resin sealing type electronic device that includes a lead structure having an island and a plurality of leads. The lead structure includes a mounting surface and a welding surface opposite from the mounting surface. The mounting surface includes a plurality of burrs standing thereon as a result of punching a metal board using a mold from the welding surface, a semiconductor die bonded to the island, a die capacitor for removing a noise of the semiconductor die. The die capacitor includes back side terminals bonded to the mounting surface of the island and the mounting surface of one of the leads. The device further includes a resin package sealing the semiconductor die, the die capacitor and the leads so that a portion of the lead bonded to the die capacitor is exposed, and an external electrode on which a portion of the welding surface of the exposed lead is welded.

DETAILED DESCRIPTION OF THE INVENTION

A first embodiment of the invention relates to the prevention of a problem that a solder plating layer 11 attached to a small lead burr 10 of a lead frame 1 formed by presswork peels off the lead burr 10 when a tie bar 9 is cut and forms a mustache-like solder burr 12 to cause short circuit between outer leads 8a and so on. The description will be given below referring to FIGS. 1 to 11.

Although there are some types of lead frame 1 for use in which a plurality of same patterns is arrayed in a single row, in two rows or in three rows, the description will be given by showing one of the patterns in detail since this embodiment is understood by describing one pattern. The description will be given using a simple package of an SIP (Single In-line Package) type as a package, provided with a series of outer leads and tie bars.

Figure 1:
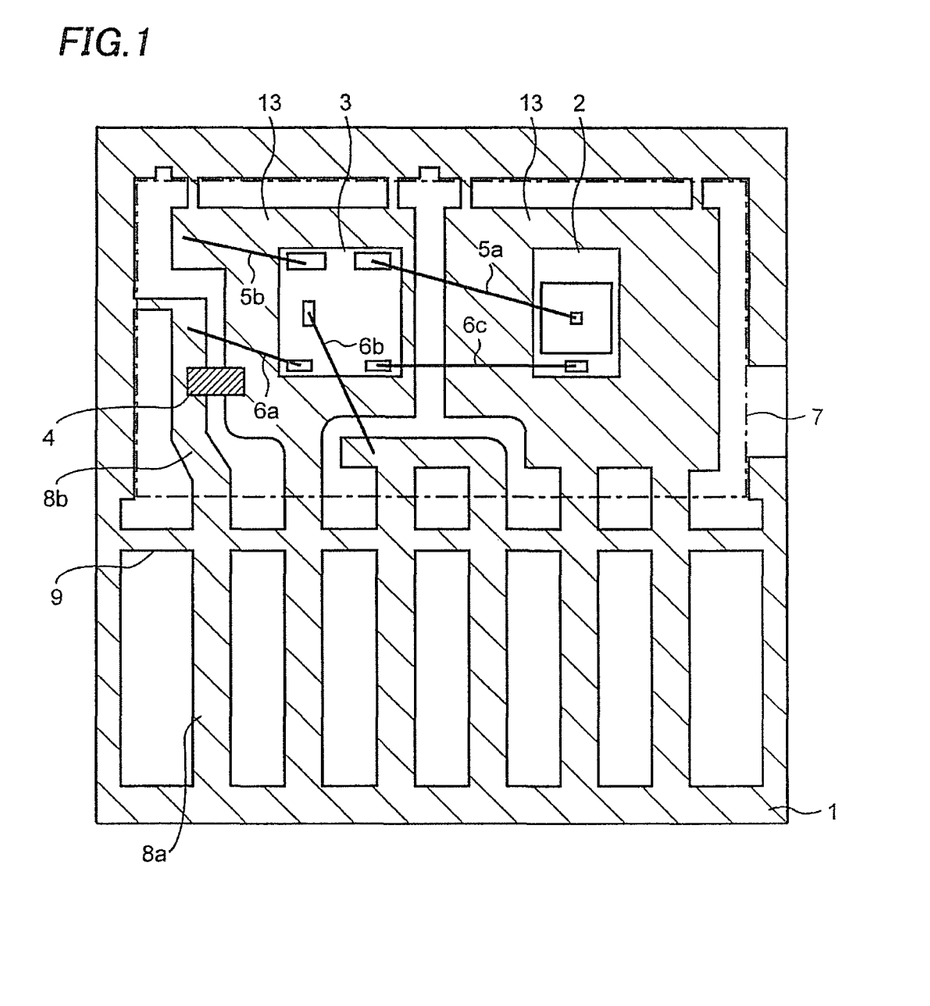
FIG. 1 is a plan view of a method of manufacturing a resin sealing type semiconductor device in a first embodiment of the invention.

First, a Cu member is pressed and formed and Ni or the like is plated on the surface thereof to provide a lead frame 1. Then, as shown in FIG. 1, a semiconductor die 2, a semiconductor die 3, a die capacitor 4 according to needs, and so on are die-bonded to islands 13 on a surface of the lead frame 1 that is opposite to the surface where the lead burrs 10 are formed by the presswork for obtaining the lead frame 1. When the semiconductor die 2 is a power transistor, this is die-bonded to the island 13 using solder paste or Ag paste. When the semiconductor die 3 is a controller semiconductor die consuming low power, this is die-bonded to the island 13 using Ag paste or insulating paste. The die capacitor is bridged between the island 13 and the inner lead 8b and also bonded to these using Ag paste or solder.

Then, the pad electrodes of the semiconductor die 2 and the semiconductor die 3 are connected by wire-bonding using a bonding wire 5a, and the pad electrode of the semiconductor die 3 and the lead frame 1 are connected by wire-bonding using a bonding wire 5b. The other necessary portions are also connected by wire-bonding using bonding wires 6a, 6b and 6c. In this case, when the semiconductor die 2 is a power device, an Al wire (an aluminum wire) is employed as the bonding wire 5a and so on. This is because the Al wire is cheap and a thick wire is obtainable in the market. When the semiconductor die 2 and so on are not a power device, an Au wire is employed and these are connected by wire-bonding by thermocompressing.

Figure 2:
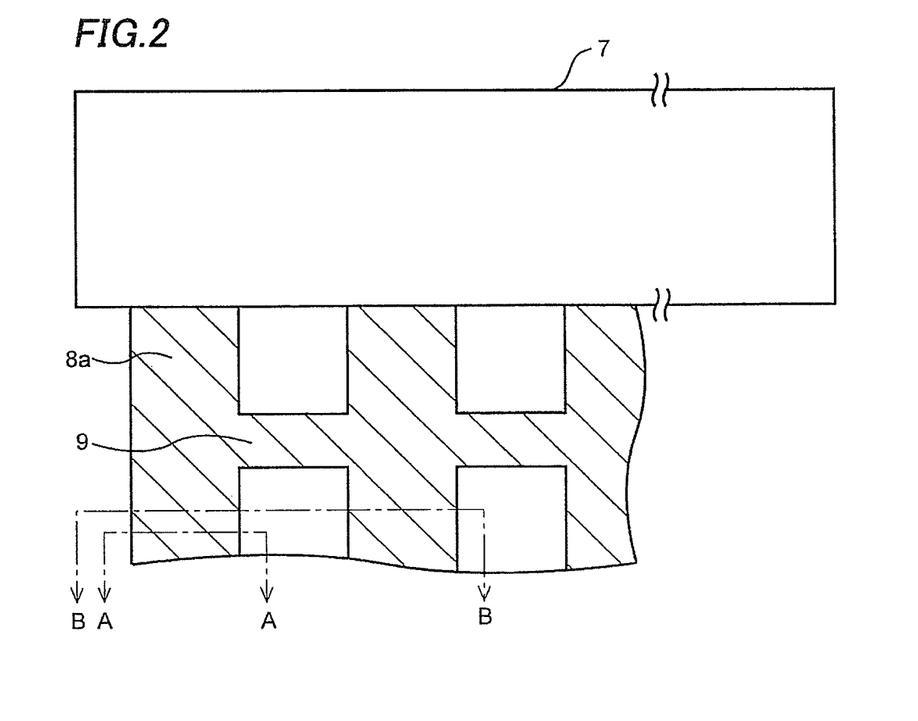
FIG. 2 is a schematic plan view showing the method of manufacturing the resin sealing type semiconductor device in the first embodiment of the invention.

Then, the semiconductor die 2 and so on are sealed using resin supplied in a resin sealing process to form a resin package 7 filled with resin in a region shown by a dashed and dotted line in FIG. 1. FIG. 2 of a simplified view will be used for the description of the subsequent processes, since this embodiment is understood by showing some of the outer leads 8a and the tie bars 9. The tie bars 9 form part of the lead frame 1, that supports the outer leads 8a until the resin sealing process is completed. In FIG. 2, since the outer leads 8a and the tie bars 9 are pressed from the front side to the back side, continuously protruding small lead burrs 10 are formed on the side surfaces on the back sides of the outer leads 8a and the tie bars 9.

Figure 3:
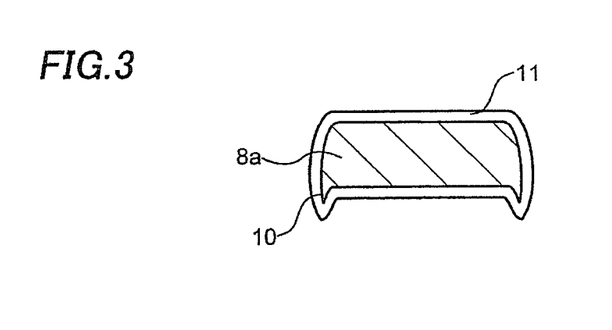
FIG. 3 is a cross-sectional view of a lead frame in the first embodiment of the invention.

FIG. 3 shows a cross-sectional view of the outer lead 8a of FIG. 2 along line A-A, and also shows a cross-sectional view of the tie bar 9 as well as the outer lead 8a. As shown in FIG. 3, the lead burrs 10 are formed protruding toward the back side of the lead frame 1. Plating is applied in this state in a solder plating process. In this case, a solder plating layer 11 is formed on the surface of the outer leads 8a and the tie bars 9, and simultaneously the solder plating layer 11 is also formed on the lead burrs 10.

Figure 4:
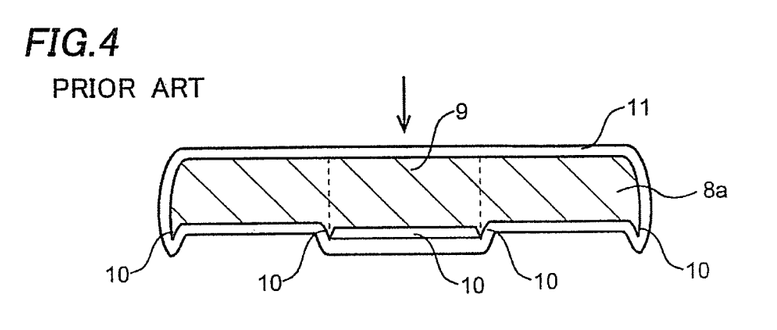
FIG. 4 is a view showing a cross-section of an outer lead and a tie bar and a cutting direction of the tie bar in a conventional embodiment.

The tie bars 9 are then cut. When the tie bars 9 are cut from the surface where the lead burrs 10 are not formed, that is on the side where the semiconductor die 2 and so on are mounted, to the surface where the lead burrs 10 are formed, as in the conventional manner, cutting dust occurring in the cutting applies pressure to the solder plating layer 11 attached to the ends of the lead burrs 10, and a thin part of the solder plating layer 11 attached to the ends of the lead burrs 10 peels off and hangs from the lead burrs 10 as mustache-like solder burrs 12. This state will be described in detail below referring to FIGS. 4 and 5. FIG. 4 is a schematic cross-sectional view of FIG. 2 along line B-B. The lead burrs 10 are formed on the lower side surface of the outer leads 8a and tie bar 9, and the solder plating layer 11 is attached to the surface of these. The tie bar 9 portion surrounded by a dotted line is to be mechanically cut from the upper side to the lower side of FIG. 4.

In this case, the tie bar 9 portion is cut in the direction shown by the arrow with grinding the boundary surfaces of the tie bar 9 and the outer lead 8a shown by the dotted line and generating cutting dust. Since a large amount of cutting dust is generated, a mass of cutting dust applies pressure to the linear solder plating layer 11 attached to the ends of the lead burrs 10, forces the solder plating layer 11 to peel off the lead burrs 10. This results in the mustache-like solder burrs 12 hanging from the lower sidewalls of the outer leads 8a as shown in FIG. 5, thereby causing a problem in reliability and so on.

Therefore, there is a need for countermeasures such as the elimination of the mustache-like solder burrs 12, or the decreasing of the number or size of the mustache-like solder burrs 12 so as not to practically cause a problem even when the mustache-like solder burrs 12 occur. As a countermeasure that solves a practical problem by decreasing the number of the mustache-like solder burrs 12 or the like, the method and position for cutting the tie bars 9 may be considered. The position for cutting the tie bars 9 may be a region A, B, C or D shown by dashed and dotted lines in FIG. 6 that shows the outer leads 8a and so on after the resin sealing process is completed.

Figure 5:
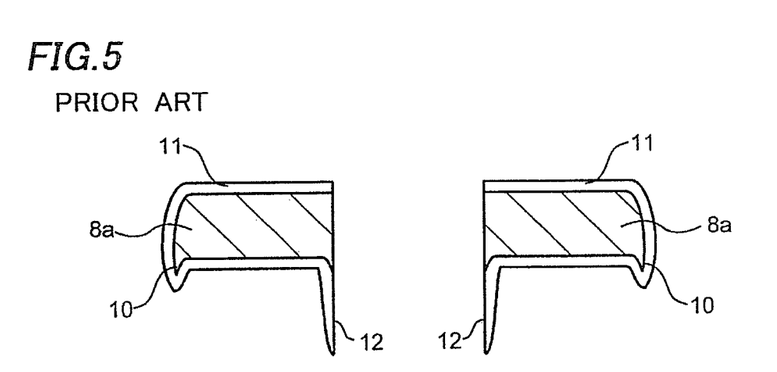
FIG. 5 is a cross-sectional view of the outer lead after the cutting of the tie bar in the conventional embodiment.
Figure 6:
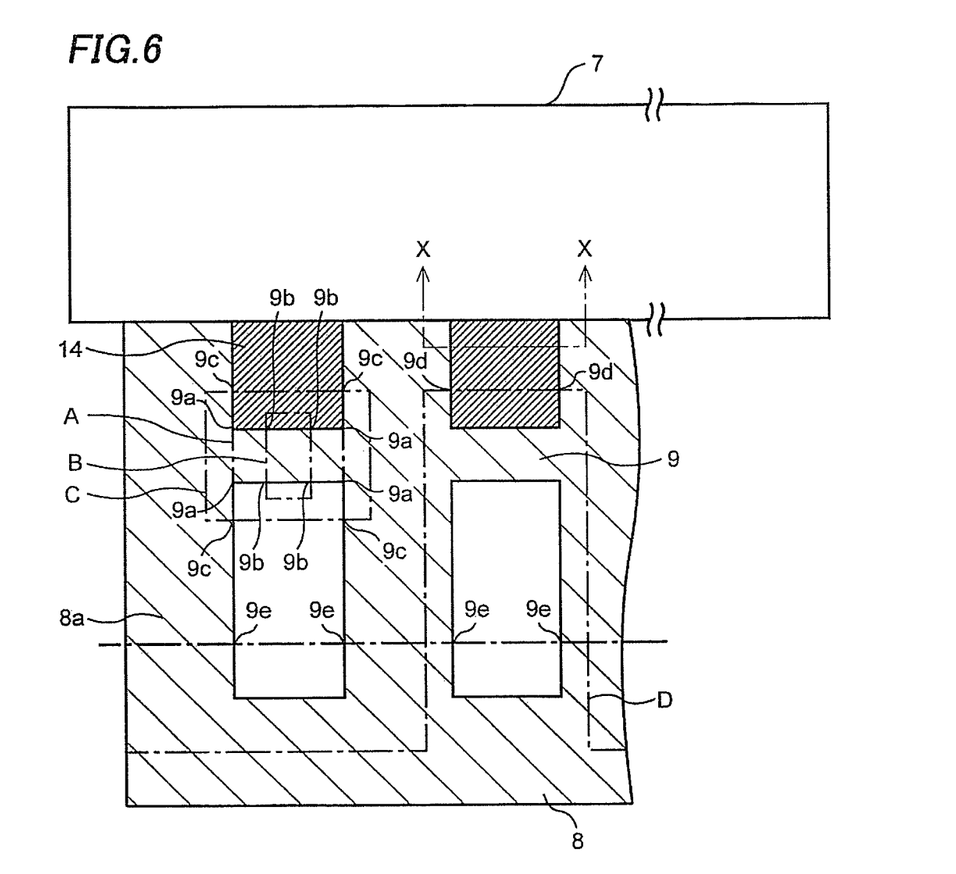
FIG. 6 is a plan view showing an outer lead portion after a resin sealing process is completed in the first embodiment of the invention.

FIGS. 4 and 5 show the cutting of the tie bar 9 only, and correspond to the cutting at the region A surrounded by four corner 9a in FIG. 6. For easy understanding, FIG. 6 shows the regions A, B and C between the pair of outer leads 8a only, but these are to be formed between all the outer leads 8a. The region D is also shown as covering one tie bar 9, but it is to cover all the tie bars 9.

In this case, the lead burr 10 on the lower portion of the side surface of the outer lead 8a and the lead burr 10 on the lower portion of the side surface of the tie bar 9 abut each other at corner portions 9a where the outer lead 8a and the tie bar 9 abut and form the large lead burrs 10. Compared with the lead burr 10 having normal size at a non-abutting portion, this makes the unstable solder plating layer 11 attached to the ends of the lead burrs 10 larger. Therefore, the mustache-like solder burrs 12 formed when the tie bar 9 is cut are also larger than that at the non-abutting portion. The large mustache-like solder burrs 12 are formed at the four abutting portions 9a shown in FIG. 6.

Next, a case of cutting only a portion of the tie bar 9 shown by the region B in FIG. 6 will be considered. In this case, the mustache-like solder burrs 12 are formed at four positions shown by portions 9b that are the cut portions on the side surface of the tie bar 9, from the unstable solder plating layer 11 attached to the ends of the lead burrs 10 on the lower portion of the side surface of the tie bar 9. Since the lead burrs 10 at these portions are formed on the tie bar 9 only, the solder burrs 12 are smaller than those in the case of the cutting at the region A. Similarly, in a case of cutting at the region C in FIG. 6, the mustache-like solder burrs 12 are formed at four positions shown by 9c that are the cut portions of the side surfaces of the outer leads 8a, on the lower portions of the side surfaces of the outer leads 8a. The sizes of these are the same as the size in the case of the cutting at the region B since the burrs 12 are caused by the lead burrs 10 on the lower portions of the side surfaces of the outer leads 8a. However, the mustache-like solder burrs 12 at the region B causes shortcircuit between the remaining tie bars 9 more easily since the distance between the remaining tie bars 9 is shorter than the distance between the pair of the outer leads 8a.

Figure 7:
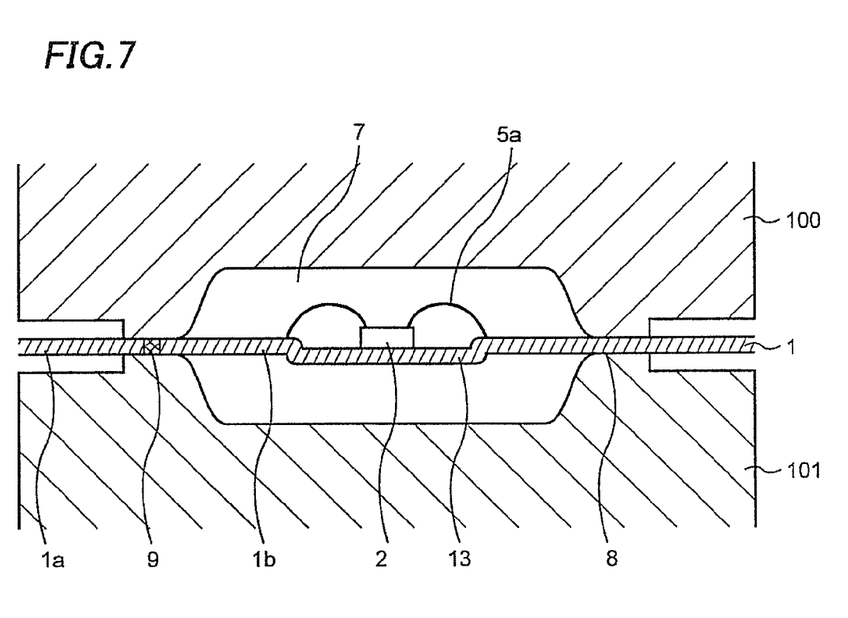
FIG. 7 is a schematic view of the lead frame where a semiconductor die and so on are mounted, which is held between an upper mold and a lower mold of a resin sealing apparatus, in the first embodiment of the invention.

FIG. 6 shows the existence of resin films 14, and these resin films 14 make the sizes of the mustache-like solder burrs 12 at the portions 9a, 9b and 9c that are in contact with the resin film 14 smaller than the sizes at the portions 9a, 9b and 9c that are not in contact with the resin film 14. Before the reason is explained, the cause of the formation of the resin films 14 will be briefly explained. The lead frame 1 where the semiconductor die 2 and so on are die-bonded to the islands 13 and so on and bonded thereto through the bonding wire 5a and so on is held between an upper mold 100 and a lower mold 101 of a resin sealing apparatus as shown in FIG. 7, the tie bars 9 and an outer frame 8 of the lead frame 1 function as a stopper for injected resin, and the resin package 7 filled with the resin is formed.

Figure 8:
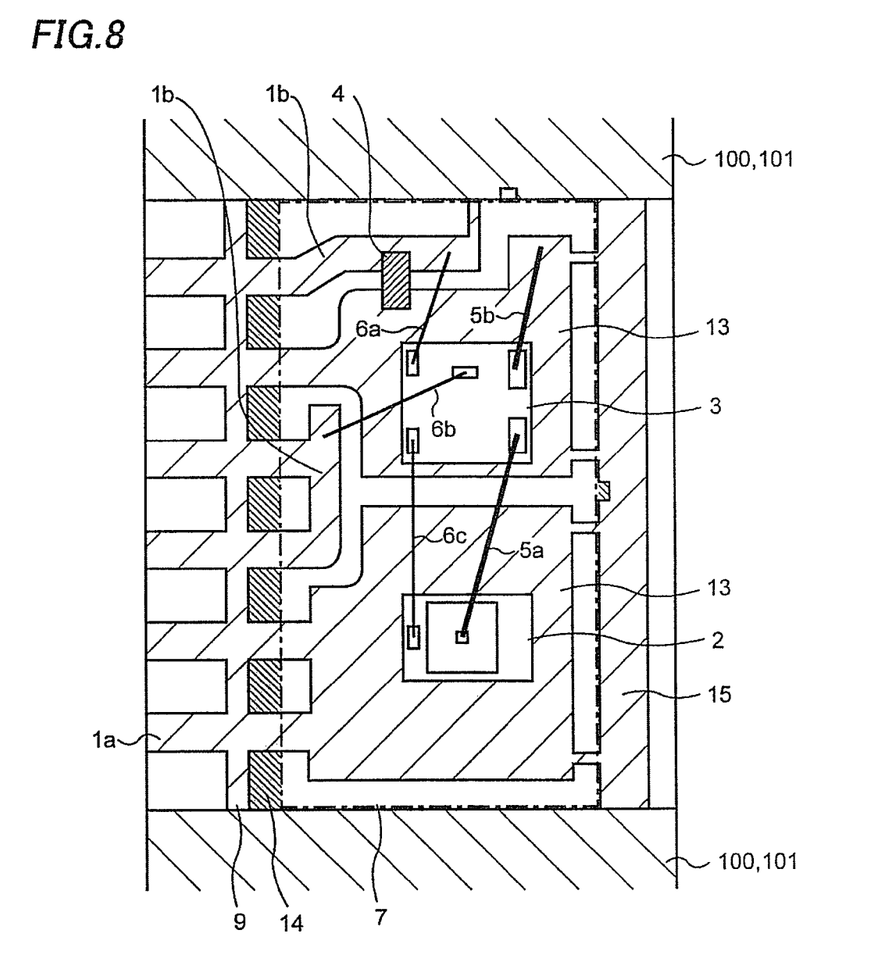
FIG. 8 is a perspective view of the lead frame where the semiconductor die and so on are mounted on the upper mold side, which is held between the upper mold and the lower mold of the resin sealing apparatus, in the first embodiment of the invention.

FIG. 8 shows a perspective view of the lead frame 1 held in the resin sealing apparatus, on the upper mold 100 side. The region surrounded by a dashed and dotted line is to form the resin package 7. On the left side of FIG. 8, the tie bars 9 held between the upper mold 100 and the lower mold 101 prevent resin from flowing to the outside of the resin package 7, as dam bars. However, the lead frame 1 does not exist at the portions shown as the resin films 14 in FIG. 8, and thus resin flows from the end of the region where the resin package 7 is to be formed to the ends of the tie bars 9 as the dam bars, in the region held between the upper mold 100 and the lower mold 101. As a result, as shown in FIGS. 6 and 8, the resin films 14 each surrounded by the pair of outer leads 8a, the tie bar 9 and the resin package 7 are formed.

Figure 9:
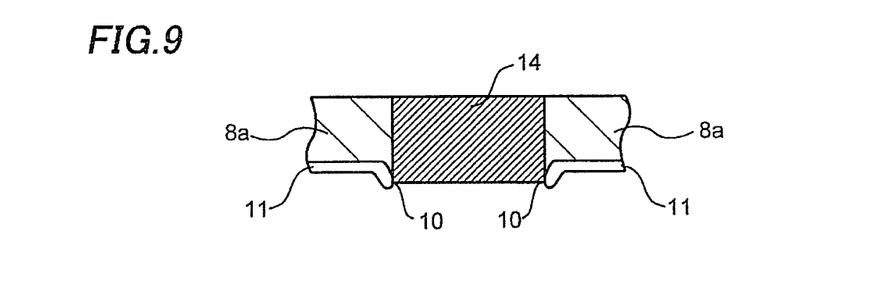
FIG. 9 is a cross-sectional view of a resin film between the outer leads after the resin sealing process is completed in the first embodiment of the invention.

The cross-sectional view of FIG. 6 along line X-X in the state after the solder plating layer 11 is formed is shown in FIG. 9. Apparent from the formation process of the resin films 14 described above, the upper surfaces of the resin films 14 have the same height as those of the abutting outer leads 8a and the lower surfaces thereof are on the ends of the lead burrs 10 of the abutting outer leads 8a in its cross-section. Therefore, since the solder plating is applied in the state where one sides of the ends of the lead burrs 10 are covered by the resin films 14, the unstable solder plating layer 11 is rather difficult to be formed on the ends of the lead burrs 10 as shown in FIG. 9, compared with the case of FIG. 3 showing the state of the solder plating layer 11 where the resin film 14 does not exist.

As a result, as described above, the sizes of the mustache-like solder burrs 12 in the portions 9a, 9b and 9c that are in contact with the resin film 14 are smaller than the sizes of the mustache-like solder burrs 12 in the portions 9a, 9b and 9c that are not in contact with the resin film 14 in the similar manner to FIG. 3. Next, a case of cutting the tie bar 9 at the region D in FIG. 6 will be considered. In this case, when the tie bar 9 is cut, the cut surface crosses the lead burrs 10 at only two positions shown by 9d in the outer lead 8a portions, where the resin film 14 exists. Therefore, by cutting the tie bar 9 at the region D, compared with the cases of the cutting at the regions A, B and C, the occurrence of the mustache-like solder burrs 12 formed from the solder plating layer 11 attached to the ends of the lead burrs 10 is largely decreased.

It means that the number of the mustache-like solder burrs 12, and so on are decreased depending on the region for cutting the tie bars 9. Totally examined, the cutting at the region D is the most advantageous, and the cutting at the region C is the second most advantageous. Therefore, employing the cutting at the region C, in particular at the region D, instead of employing the cutting at the conventional region A, has a large effect for decreasing the mustache-like solder burrs 12. Therefore, when the embodiment that will be described below is difficult to be employed, this countermeasure is effective for decreasing the occurrence of the mustache-like solder burrs 12 as the second best countermeasure.

Even the cutting at the region D does not completely prevent the occurrence of the mustache-like solder burr. It is difficult to predict when the resin film 14 unstably supported in the region surrounded by the pair of outer leads 8a, the tie bar 9 and the sealing resin 7 peels off. Once the resin film 14 peels off, the end of the lead burr 10 is exposed and causes the formation of the mustache-like solder burr 12. In particular, when a process of removing the resin films 14 by high-pressure water or the like is employed before the solder plating process, the lead burrs 10 are exposed and the solder plating layer 11 is formed on these lead burrs 10, thereby causing the formation of the mustache-like solder burrs 12.

Although the cutting of the tie bars 9 may be performed before the solder plating process, when solder plating is performed by electroplating, it is preferable that at least a portion of the outer frame 8 of the lead frame 1 connecting the outer leads 8a is not cut and left as it is in order to form the uniform solder plating layer 11 on each of the outer leads 8a. When the tie bars 9 are cut but the portion of the outer frame 8 is still connected to the outer leads 8a and then solder-plated, the solder plating layer 11 is also formed on the lead burrs 10 formed at portions 9e that are on the cut surface of the outer frame 8. Therefore, when the outer leads 8a are separated by cutting this part after the solder plating, the mustache-like solder burrs 12 may be formed at the cut portions 9e, and the problem described above is not solved.

Figure 10:
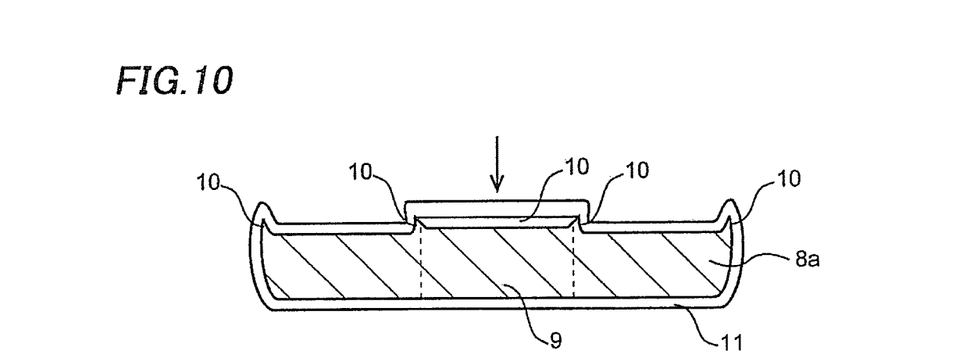
FIG. 10 is a view showing a cross-section of the outer lead and a tie bar and a cutting direction of the tie bar in the first embodiment of the invention.

The first embodiment of the invention is directed to elimination of such a mustache-like solder burr 12. The formation of mustache-like solder burrs 12 is prevented by cutting the tie bar 9 portion from the surface of the lead frame 1 on which the lead burrs 10 stand, as shown by an arrow in FIG. 10. As shown in FIG. 10, the tie bar 9 is cut from the lead burrs side. It is noted that the lead frame 1 is placed upside down in FIG. 10 from the position shown in FIG. 3. Even by the cutting in this manner, the cut tie bar 9 portion still causes the grinding of the boundary surfaces of the tie bar 9 and the outer lead 8a, the cutting still generates cutting dust, and the amount of the generated cutting dust is still large.

Figure 11:
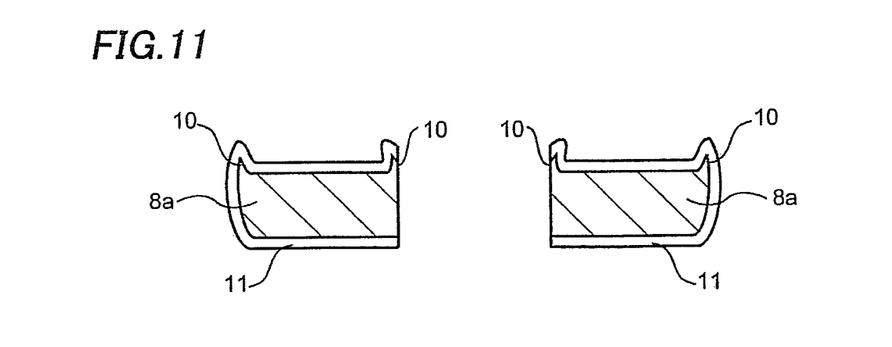
FIG. 11 is a cross-sectional view of the outer lead after the cutting of the tie bar in the first embodiment of the invention.

However, the lead burr 10 does not exist on the back surface of the lead 8a because the tie bar 9 is cut from the lead burrs side, and the unstable solder plating layer 11 attached to the end of the lead burr 10 does not also exist. Only the solder plating layer 11 firmly attached to the outer lead 8a and so on exists instead. Therefore, as shown in FIG. 11, the firmly attached solder plating layer 11 does not peel off even by the large amount of cutting dust generated when the tie bar 9 is cut, and thus the mustache-like solder burr 12 does not occur. Finally, a lead bending process and so on are performed, and a desirable resin sealing type electronic device is completed.

A second embodiment of the invention will be described. This case differs from the first embodiment only in that the surface of the lead frame 1 where the semiconductor die 2 and so on are die-bonded is on the side where the lead burrs 10 are formed by presswork. Therefore, the detailed description will be omitted. In the second embodiment, it should be noted that the bonding of the die capacitor 4 and so on to the lead frame 1 may not be successfully completed when the lead burr 10 exists and the electrode surface of the die capacitor 4 and the end of the lead burr 10 directly contact. This is because the two electrodes of the die capacitor 4 may contact the two lead burrs 10 having different lengths and the die capacitor 4 may be bonded thereto with slanting.

The description of the first and second embodiments is given using a SIP type package, but the invention is also applicable to other package such as a DIP (a Dual In-line Package) type package as long as the concept of the invention is unchanged.

Next, a third embodiment of the invention will be described referring to figures. The third embodiment relates to a resin sealing type electronic device that utilizes an advantageous effect of the existence of a lead burr 30 and uses a lead frame for avoiding a disadvantage of the lead burr 30. The same figures as those of the first embodiment are also used, but the description will be given by changing numerals and expressions from a different aspect. The third embodiment also has a feature in a resin sealing type electronic device using a lead frame formed by punching using a mold. Punching using a mold is the same as presswork in the first embodiment. First, a structure of the lead frame will be described, and then a structure of attachment of the resin sealing type electronic device to an external electrode will be described.

Figure 12:
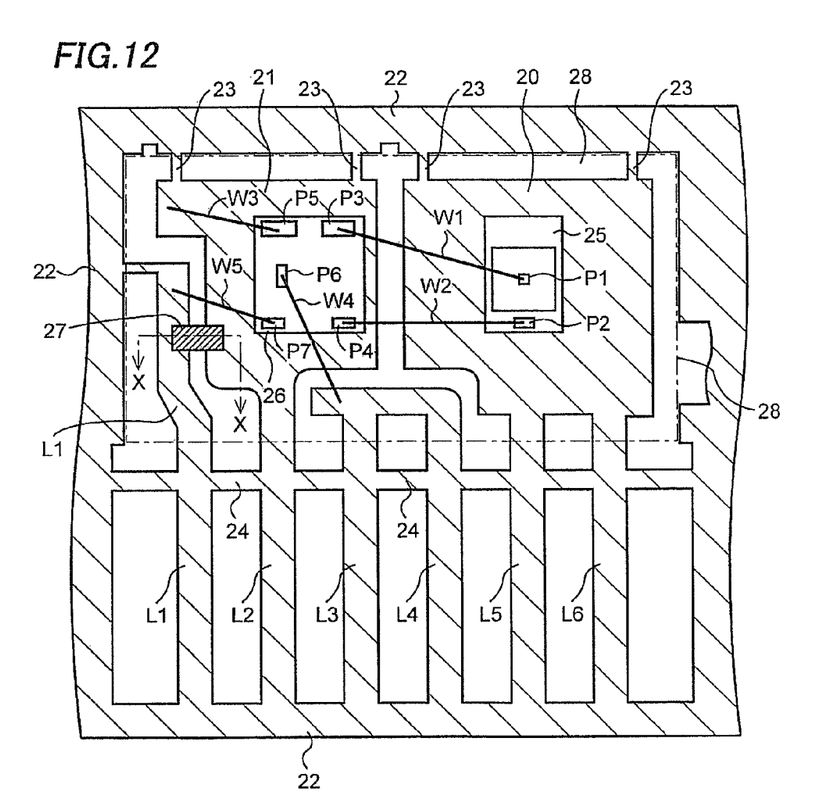
FIG. 12 is a plan view of a lead frame in a third embodiment of the invention.

FIG. 12 is a plan view of a lead frame of SIP (a Single In-line Package). As shown in the figure, two islands 20 and 21 are supported by hanging leads 23 extending from a supporting portion 22 of the lead frame.

Furthermore, six leads L1 to L6 extend from the supporting portion 22 of the lead frame in the same direction. The lead L1 extends to a position near the island 21, and the lead L2 is connected to the island 21. The leads L3 and L4 extend to a position near the islands 20, 21, and the end portions of these are connected. The leads L5 and L6 are connected to the island 20. The leads L1 to L6 are supported by tie bars 24 extending from the supporting portion 22 of the lead frame.

An IGBT (Insulated Gate Bipolar Transistor) die 25 is bonded to the main surface of the island 20 using conductive paste. Furthermore, a control IC die 26 for controlling the IGBT die 25 is bonded to the main surface of the island 21 next to the island 20 using conductive paste. In this case, a P-channel type MOSFET or a power bipolar transistor may be used instead of the IGBT. Furthermore, a die capacitor 27 for removing noise of the control IC die 26 is bonded to the island 21 and the lead L1 using conductive paste. The die capacitor 27 has two back side electrodes, and one back side electrode is electrically and mechanically connected to the main surface of the island 21 where the control IC die 26 is bonded, and the other back side electrode is electrically and mechanically connected to the lead L1.

Since the die capacitor 27 is bridged between the island 21 and the lead L1, if there is a height difference between the island 21 and the lead L1, the bonding capability of the die capacitor 27 decreases. Therefore, in order to make the main surfaces of the island 21 and the lead L1 almost flush with each other, it is preferable that the end of the lead L1 is also supported by the hanging lead 23.

Furthermore, in order to make a necessary electrical connection between the IGBT die 25 and the control IC die 26, metal wires for wire-bonding are formed. In detail, a pad P1 (a source electrode) and a pad P2 (a gate) are formed on the front surface of the IGBT die 25, and five pads P3 to P7 are formed on the front surface of the control IC die 26. Then, the pad P1 and the pad P3 are connected through a metal wire W1, the pad P2 and the pad P4 are connected through a metal wire W2. The pad P5 and the island 21 are connected through a metal wire W3, the pad P6 and the connected portion of the leads L3 and L4 are connected through a metal wire W4, and the pad P7 and the lead L1 are connected through a metal wire W5.

Figure 13:
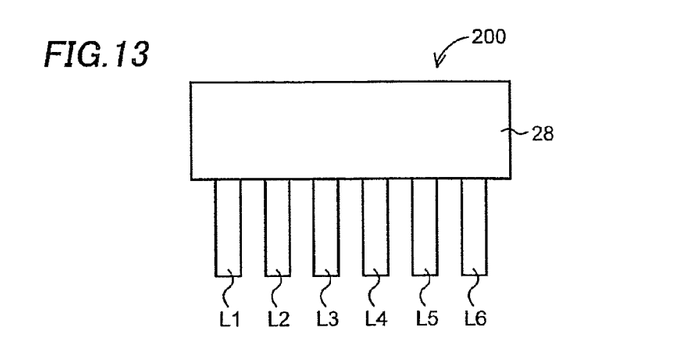
FIG. 13 is a view showing an outline of a resin sealing type electronic device using the lead frame of FIG. 12.

After the lead frame structure described above is formed, the IGBT die 25, the control IC die 26 and the die capacitor 27 are sealed by a resin package 28 made of insulating resin filling a region shown by a dashed and dotted line in FIG. 12. Furthermore, after the resin package 28 is formed, for the leads L1 to L6, the supporting portion 22 of the lead frame is cut and simultaneously the tie bars 24 are cut. Portions of the leads L1 to L6 extending from the resin package 28 become outer leads. By this, a resin sealing type electronic device 200 as shown in FIG. 13 is formed.

Figure 14A:
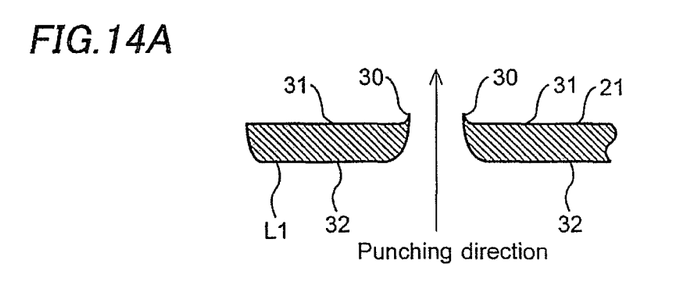
FIGS. 14A and 14B are views showing a relation between a punching direction of the lead frame and a bonding surface of a die capacitor in the third embodiment of the invention.
Figure 14B:
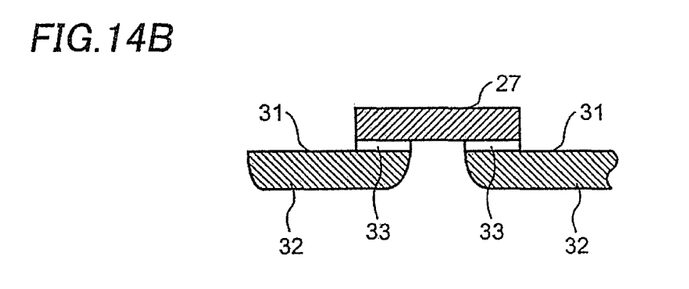

Next, in the resin sealing type electronic device 200, the relation of the punching direction of the lead frame and the attachment surface of the die capacitor 27 will be described referring to FIGS. 14A and 14B. FIGS. 14A and 14B are cross-sectional views of FIG. 12 along line X-X.

As shown in FIG. 14A, when a metal board that is the material of the lead frame is punched in the arrow direction in the figure, the lead burrs 30 are formed on the upper surfaces of the end portions of the lead L1 and the island 21 by the grinding of the mold and the metal member. The surfaces where these lead burrs 30 are formed are burr formation surfaces 31, and the opposite surfaces to these are rounded surfaces 32 of which the end portions are rounded.

In this case, as shown in FIG. 14B, the die capacitor 27 is bonded to the burr formation surfaces 31 of the lead L1 and the island 21 using conductive paste 33 made of Ag paste or the like. Since the burr formation surface 31 has a larger surface area than the rounded surface 32, by bonding the die capacitor 27 to the burr formation surfaces 31, i.e., by using the burr formation surfaces 31 as attachment surfaces, a large bonding area is obtained and the connection failure of the die capacitor 27 is prevented.

In this case, it is preferable that the conductive paste 33 made of Ag paste or the like for bonding the die capacitor 27 to the lead frame has an enough thickness so that the die capacitor 27 and the lead burrs 30 do not directly contact. This is for preventing the die capacitor 27 mounted on the lead frame from slanting due to the difference between the lengths of the lead burrs 30 on the lead and the island where the two electrodes of the die capacitor 27 are mounted. Furthermore, before the die capacitor 27 is bonded, it is preferable to flatten the burr formation surfaces 31 by pressurization using a pressing jig such as a plate to remove the burrs 30 in advance in order to enhance the connection capability of the die capacitor 27.

Figure 15:
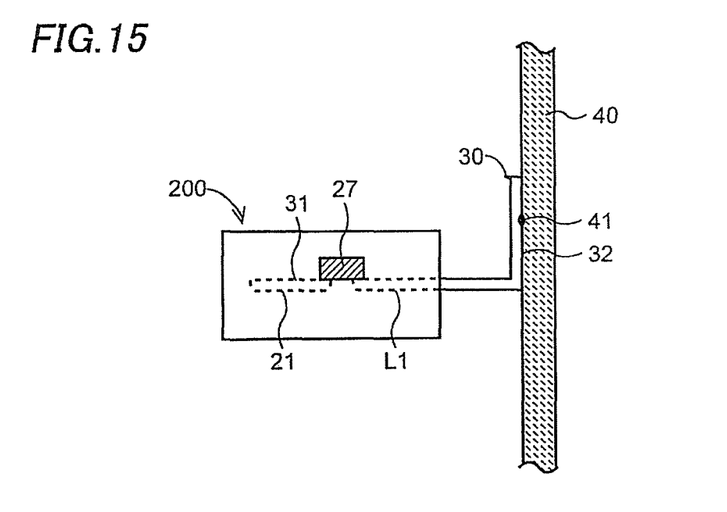
FIG. 15 is a view showing the connection of the resin sealing type electronic device and an external electrode in the third embodiment of the invention.

FIG. 15 is a view showing a structure of attachment of the resin sealing type electronic device 200 described above. As shown in the figure, a control electrode 40 (an example of "the external electrode") is provided vertically in an electronic control portion of an automobile. On the side surface of this control electrode 40, the bended lead L1 (the outer lead portion) is welded at a welding portion 41. As this welding method, it is preferable to use spot-welding in order to obtain the small welding portion 41. In this case, the welding surface of the lead L1 is the rounded surface 32. In detail, since the back side of the burr formation surface 31 where the lead burrs 30 are formed is welded, the spot welding is not prevented by the lead burrs 30 and a welding failure due to the lead burrs 30 is prevented. Furthermore, the mechanical strength against the vibration of the automobile is enhanced.

Furthermore, the following byproduct effect is also obtained. In detail, the surface of the resin sealing type electronic device 200 where the part number and so on are stamped is usually the resin surface on the burr formation surface 31 side that is the surface where the IGBT die 25 and so on are mounted. Then, the lead L1 and so on are bended toward the burr formation surface 31 that is the surface where the part number and so on are stamped. Therefore, when the lead L1 is welded to the control electrode 40 vertically standing, the lead L1 and the control electrode 40 are welded without fail while checking the part number and so on of the resin sealing type electronic device 200 positioned below the welding portion, without prevention by the resin sealing type electronic device 200 itself. After the welding, the part number and so on of the resin sealing type electronic device 200 are easily checked from above.

In this manner, in the embodiment, since the die capacitor 27 is bonded to the burr formation surface 31 of the lead L1 and the rounded surface 32 of the lead L1 is welded to the control electrode 40, the welding failure of the lead L1 to the control electrode 40 is prevented, the large area for bonding the die capacitor 27 to the lead L1 is obtained to prevent a connection failure, and an desirable attachment structure of the resin sealing type electronic device 200 is obtained as a whole.

The third embodiment is described using SIP of six terminals as an example, the invention is also applicable to a resin sealing type electronic device of other type. Furthermore, the die capacitor 17 is an example of an electronic component, and an electronic component of any other type may be used as long as it is bonded to a lead.

By the method of manufacturing the resin sealing type semiconductor device of the invention, the resin sealing type semiconductor device with high reliability is manufactured by preventing the mustache-like solder burr 12 caused by the lead burr 10 formed on the lead frame 1 by presswork.

Furthermore, the resin sealing type electronic device of the invention prevents a failure in welding the outer lead to an external electrode, and secures the large connection area of the electronic component to the lead to prevent a connection failure therebetween.

What is claimed is:

1. A resin sealing type electronic device comprising:
a lead comprising an electronic component mounting surface and a welding surface opposite from the component mounting surface, the electronic component mounting surface comprising a plurality of burrs standing thereon as a result of punching a metal board using a mold from the welding surface;
an electronic component bonded directly to the burrs on the electronic component mounting surface of the lead;
a resin package sealing the electronic component and the lead so that a part of the lead is exposed from the package; and
an external electrode on which a portion of the welding surface of the exposed lead is welded.

2. The resin sealing type electronic device of claim 1, wherein the electronic component comprises a die capacitor, and a back side terminal of the die capacitor is bonded to the electronic component mounting surface of the lead.

3. The resin sealing type electronic device of claim 1, wherein the external electrode is a control electrode of an electronic control portion of an automobile.

4. A resin sealing type electronic device comprising:
a lead structure comprising an island and a plurality of leads, the lead structure comprising a mounting surface and a welding surface opposite from the mounting surface, the mounting surface comprising a plurality of burrs standing thereon as a result of punching a metal board using a mold from the welding surface;
a semiconductor die bonded to the island;
a die capacitor for removing a noise of the semiconductor die, the die capacitor comprising back side terminals bonded directly to the burrs on the mounting surface of the island and the mounting surface of one of the leads;

a resin package sealing the semiconductor die, the die capacitor and the leads so that a portion of the lead bonded to the die capacitor is exposed; and an external electrode on which a portion of the welding surface of the exposed lead is welded.

5. The resin sealing type electronic device of claim 4, wherein the external electrode is a control electrode of an electronic control portion of an automobile.

* * * * *